United States Patent
Zhu et al.

(10) Patent No.: US 7,436,025 B2
(45) Date of Patent: Oct. 14, 2008

(54) TERMINATION STRUCTURES FOR SUPER JUNCTION DEVICES

(75) Inventors: Ronghua Zhu, Chandler, AZ (US); Amitava Bose, Tempe, AZ (US); Vishnu K. Khemka, Phoenix, AZ (US); Todd C. Roggenbauer, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 76 days.

(21) Appl. No.: 11/540,770

(22) Filed: Sep. 29, 2006

(65) Prior Publication Data

US 2008/0079122 A1    Apr. 3, 2008

(51) Int. Cl.
*H01L 29/76* (2006.01)

(52) U.S. Cl. ............... 257/339; 257/341; 257/343; 257/492; 257/493; 257/E29.256; 257/E29.257

(58) Field of Classification Search ........... 257/492, 257/493, E29.256, E29.257, 339, 341, 343
See application file for complete search history.

(56) References Cited

U.S. PATENT DOCUMENTS

| | | | |
|---|---|---|---|
| 6,882,023 B2 | 4/2005 | Khemka et al. | |
| 6,906,381 B2 | 6/2005 | Peyre-Lavigne et al. | |
| 6,982,459 B2 | 1/2006 | Suzuki et al. | |
| 7,276,766 B2 * | 10/2007 | Tu et al. | 257/343 |
| 2004/0207047 A1 | 10/2004 | Khemka et al. | |
| 2006/0043434 A1 * | 3/2006 | Huang et al. | 257/288 |

FOREIGN PATENT DOCUMENTS

WO    2004/042825 A1    5/2004

OTHER PUBLICATIONS

U.S. Appl. No. 11/390,796, filed Mar. 27, 2006, Khemka et al.
Udrea, T. et al., Ultra-high voltage device termination using 3D RESURF (Super-Junction) concept-experimental demonstration at 6.5 kV, Proceedings of 2001 International Symposium on Power Semiconductor Devices & IC, Osaka, pp. 129-132.

(Continued)

*Primary Examiner*—Long K Tran
(74) *Attorney, Agent, or Firm*—Ingrassia, Fisher & Lorenz, P.C.

(57) ABSTRACT

A semiconductor device 10 is provided. A first layer 12 has a first dopant type; a second layer 14 is provided over the first layer 12; and a third layer 16 is provided over the second layer and has the first dopant type. A plurality of first and second semiconductor regions 22, 24 are within the third layer. The first semiconductor region 22 has the first dopant type, and the second semiconductor region 24 has the second dopant type. The first and second semiconductor regions 22, 24 are disposed laterally to one another in an alternating pattern to form a super junction, and the super junction terminates with a final second semiconductor region 24, 24' of the second dopant type.

20 Claims, 3 Drawing Sheets

OTHER PUBLICATIONS

Bai, Y., et al., Junction Termination Techniques for Super Junction Devices, ISPSO May 22-25, 2000 Toulouse, France, pp. 257-261.

Zhu, R., et al., A 0.25-Micron Smart Power Technology Optimized For Wireless and Consumer Applications, Freescale Semiconductor, Inc.

Parthasaranthy, V., et al., A 0.25 uM CMOS based 70V smart power technology with deep trench for high-voltage isolation, Freescale Semiconductor, Inc.

International Search Report and Written Opinion.

* cited by examiner

TERMINATION STRUCTURES FOR SUPER JUNCTION DEVICES

FIELD OF THE INVENTION

The present invention generally relates to a semiconductor device having a super junction and a method for forming a semiconductor device having a super junction, and more particularly relates to a termination structure for a super junction device.

BACKGROUND OF THE INVENTION

Semiconductor devices include integrated circuits formed on semiconductor substrates, or wafers. The wafers are then sawed into microelectronic dies (or "dice"), or semiconductor chips, with each die carrying a respective integrated circuit. Each semiconductor chip is mounted to a package, or carrier substrate, which is often mounted to a motherboard and installed in various electronic systems.

Some electronic components with semiconductor devices must be designed to be tolerant of high currents and voltages that are present in some power applications. Power lateral double-diffused metal-oxide-semiconductor (LDMOS) field-effect-transistor (FET) devices, referred to herein as power LDMOS devices, are becoming increasingly popular for power applications.

Drain-to-source on-resistance ("$R_{DS,ON}$") is an important device parameter for power devices, and particularly impacts die size and cost. There exists a fundamental trade-off between power device breakdown voltage and $R_{DS,ON}$. One of the ongoing struggles in the field of power devices is to improve this trade-off to enable circuit designers to reduce the size of power devices. Reduced surface field (RESURF) is a popular technique for power device design that can provide an improved trade-off between breakdown voltage and $R_{DS,ON}$. However, any modifications in the device structure to improve its breakdown voltage can result in degradation in its $R_{DS,ON}$.

Accordingly, it is desirable to provide a semiconductor device with reduced resistance without adversely affecting the breakdown voltage of the device. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The various embodiments will hereinafter be described in conjunction with the following drawing figures, wherein like numerals denote like elements, and wherein.

DETAILED DESCRIPTION OF THE INVENTION

The following detailed description is merely exemplary in nature and is not intended to limit the invention or the application and uses of the invention. Furthermore, there is no intention to be bound by any theory presented in the preceding background of the invention or the following detailed description of the invention. It should also be noted that FIGS. 1-4 are merely illustrative and may not be drawn to scale.

Figure 1:
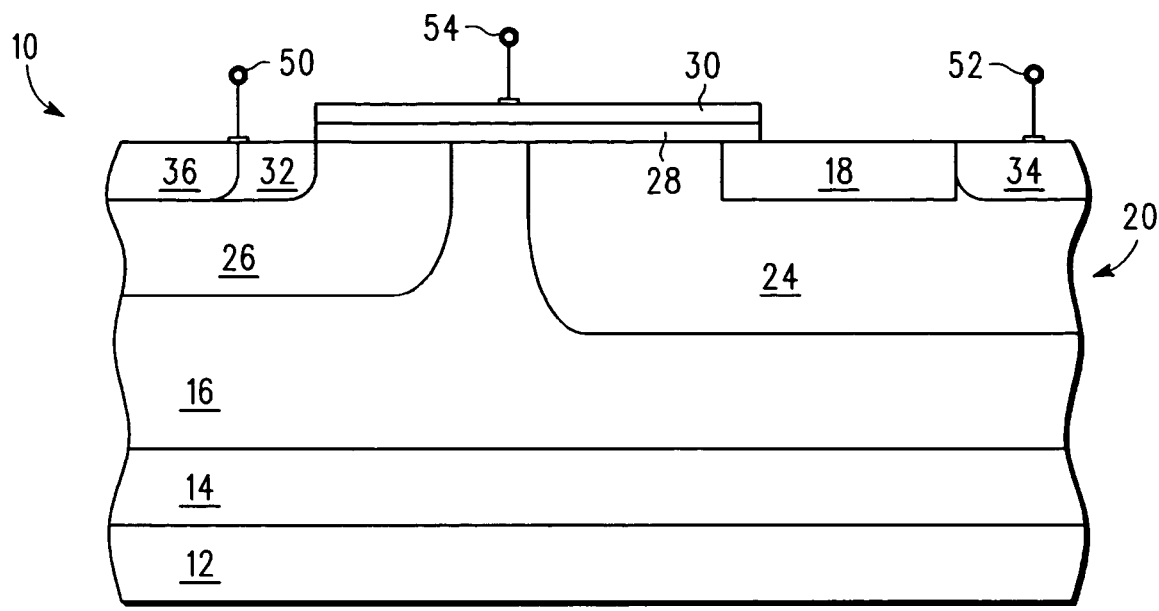
FIG. 1 is a cross-sectional view of a portion of a semiconductor device according to one embodiment.
Figure 2:
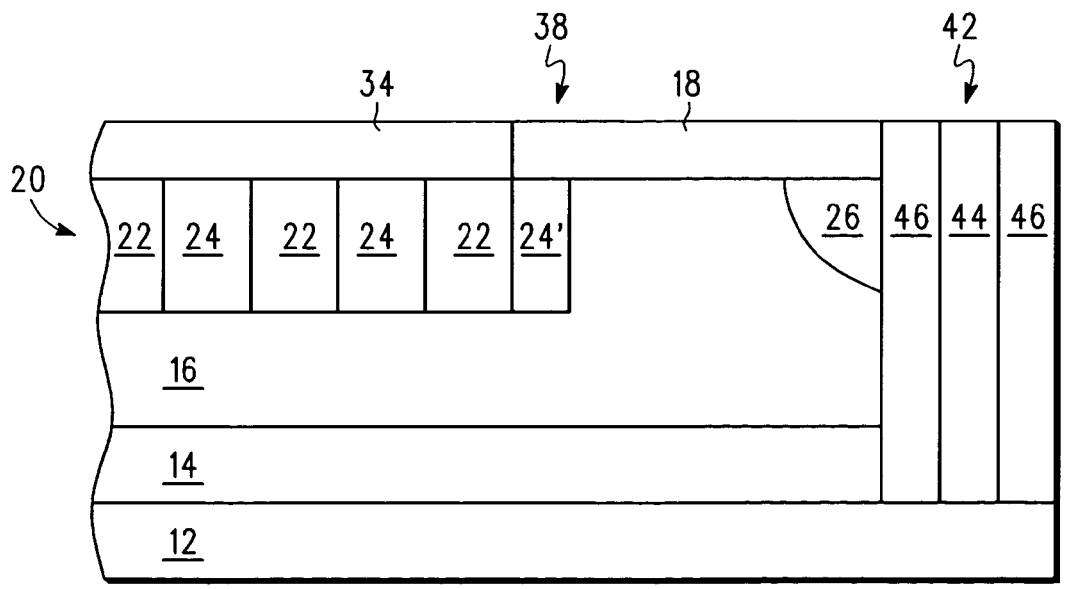
FIG. 2 is a partial, cross-sectional side view of the semiconductor device shown in FIG. 1.
Figure 3:
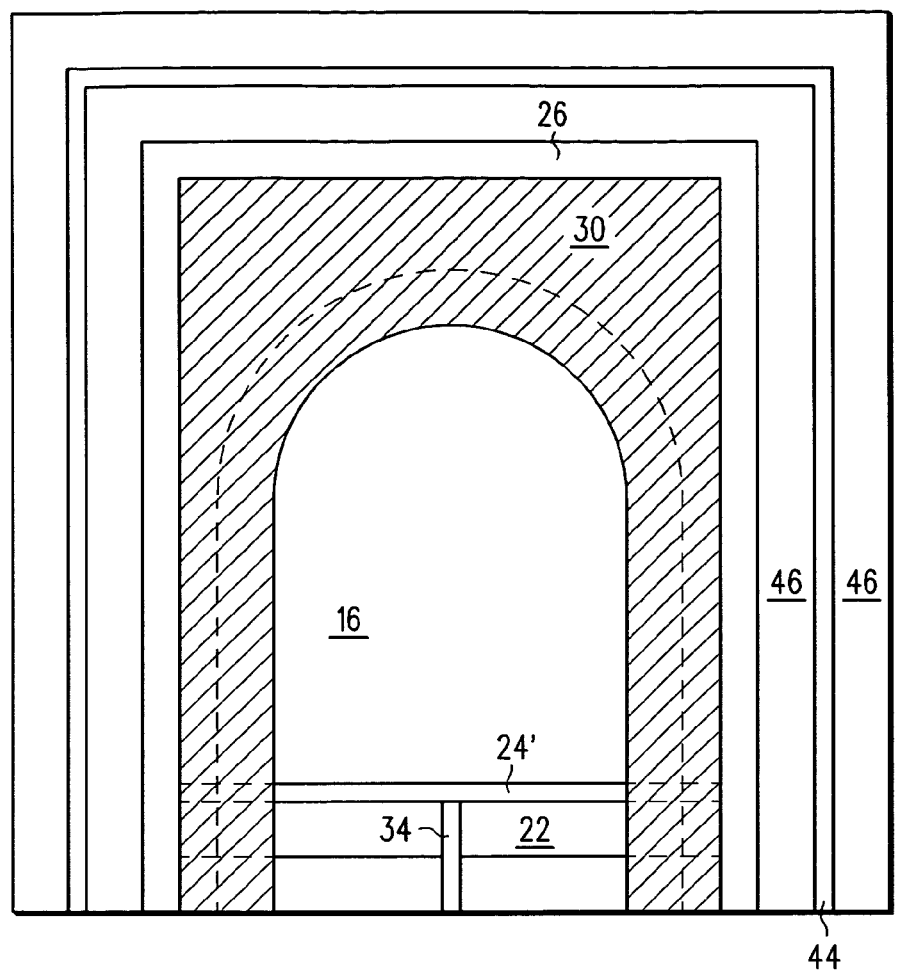
FIG. 3 is a partial, plan view of the semiconductor device shown in FIG. 1.

FIGS. 1-3 illustrate various views of a device 10 according to one embodiment. As shown in FIG. 1, the device 10 includes a semiconductor substrate 12, e.g., a substrate including one or more semiconductor materials, such as gallium arsenide (GaAs) or gallium nitride (GaN), but is generally referred to herein, without loss of generality, as being silicon (Si). The substrate 12 can have a thickness of, for example, between approximately 300 and 1000 microns. The semiconductor material of the substrate 12 may be of a first conductivity type, or doped with a first dopant type, as is commonly understood in the art. In the example illustrated in FIGS. 1-3, the substrate 12 is a "P-type" semiconductor substrate and is doped with boron (B) to a concentration of, for example, approximately $1.0 \times 10^{15}$ atoms per $cm^3$.

The semiconductor substrate 12 may include a layer 14 formed using, for example, Silicon-On-Insulator (SOI) or bulk silicon (Si) technology. The layer 14 may have a thickness of, for example, between approximately 0.1 and 3 microns. The layer 14 can be a buried oxide layer if SOI technology is used. In the alternative, the layer 14 can be an N-type doped buried layer if bulk Si technology is used and doped with a relatively high concentration of antimony (Sb) of approximately $1.0 \times 10^{19}$ atoms per $cm^3$.

An epitaxial layer 16 is provided on the layer 14. The epitaxial layer 16 may have a thickness of, for example, between 0.1 and 10 microns, and the semiconductor material of the epitaxial layer 16 may have the first conductivity type (i.e., P-type). In one embodiment of the present invention, the epitaxial layer 16 is doped with boron to a concentration of, for example, approximately $1.0 \times 10^{15}$ atoms per $cm^3$.

A shallow trench isolation (STI) region 18 is formed on, or in, the upper surface of the epitaxial layer 16. As is commonly understood in the art, the STI region 18 may be formed by etching a trench into the upper surface of the epitaxial layer 16 and filling the trench with an insulating material, such as a field oxide. The STI region 18 may have a thickness of, for example, between 0.3 and 1 microns. The width of the STI region 18 may be appropriately adjusted depending on the voltage requirements of the semiconductor device 10, as is commonly understood, and is typically between 0.5 and 100 microns. The STI region 18 may extend across the epitaxial layer 16.

A plurality of high voltage wells 20 are formed within the epitaxial layer 16 adjacent to and below the STI region 18. In an embodiment, the high voltage wells 20 are formed using ion implantation and include a plurality of P-type regions 22 and N-type regions 24. As best shown in FIG. 2, the P-type regions 22 and N-type regions 24 are laterally disposed relative to one another in an alternating pattern. The alternating P-type regions 22 and N-type regions 24 form a "super junction."

The P-type regions 22 can be doped with, for example, boron with a concentration of, for example, between $1.0 \times 10^{16}$ atoms per $cm^3$ and $5.0 \times 10^{17}$ atoms per $cm^3$. The P-type regions 22 may have a thickness of approximately 0.5 to 10 microns. The N-type regions 24 may be doped with, for example, phosphorous (P) to a concentration of, for example, between $1.0\times10^{16}$ and $5.0\times10^{17}$ atoms per cm$^3$. The N-type regions 24 may have a thickness of approximately 0.5 to 10 microns.

Referring again to FIG. 1, a body region 26 is next formed in the upper surface of the epitaxial layer 16. The body region 26 may be formed using ion implantation and have the first conductivity type (i.e., P-type). The body region 26 may be doped with boron to a concentration of, for example, approximately $1.0\times10^{17}$ to $5.0\times10^{17}$ atoms per cm$^3$. The body region 26 may have a thickness of approximately 1.0 to 3.0 microns and be positioned such that a gap lies between the body region 26 and the high voltage wells 20 across the upper surface of the epitaxial layer 16. In an alternate embodiment, the body region 26 can be immediately adjacent the high voltage wells 20.

A gate dielectric 28 and a gate electrode 30 are formed on the upper surface of the epitaxial layer 16. The gate dielectric 28 and gate electrode 30 have been removed from FIG. 2 for clarity. The gate dielectric 28 and the gate electrode 30 may lie across the gap between the body region 26 and the high voltage wells 20 to partially cover the body region 26, the high voltage wells 20, and the STI region 18. The gate dielectric 28 is made of an insulating material, such as silicon oxide, and has a thickness of, for example, approximately 100 to 1000 angstroms. The gate electrode 30, in one embodiment, is made of poly-silicon and has a thickness of approximately 0.2 to 1.0 microns.

A source region 32 can be formed within the body region 26. The source region 32 may have a thickness of, for example, between approximately 0.1 and 1 microns. The source region 32 may be formed using ion implantation and have N-type conductivity, being doped with phosphorous having a concentration of, for example, between $1.0\times10^{20}$ atoms per cm$^3$ and $1.0\times10^{21}$ atoms per cm$^3$.

A drain region 34 can be formed on the epitaxial layer 16 across the high voltage wells 20 adjacent to the STI region 18 on a side opposing the gate electrode 30. The drain region 34 may also be formed using ion implantation, have N-type conductivity, and include, for example, phosphorous ions with a concentration of approximately $1.0\times10^{20}$ to $1.0\times10^{21}$ atoms per cm$^3$.

A body contact region 36 can be formed in the upper surface of the epitaxial layer 16 within the body region 26 and adjacent to the source region 32. The body contact region 36 has a thickness similar to the source region 32. The body contact region 36 may be formed using ion implantation and may include boron ions with a concentration of, for example, approximately $1.0\times10^{20}$ atoms per cm$^3$.

Additionally, other components as are known in the art may be included in the formation of the device, although not shown or described in detail.

Figure 4:
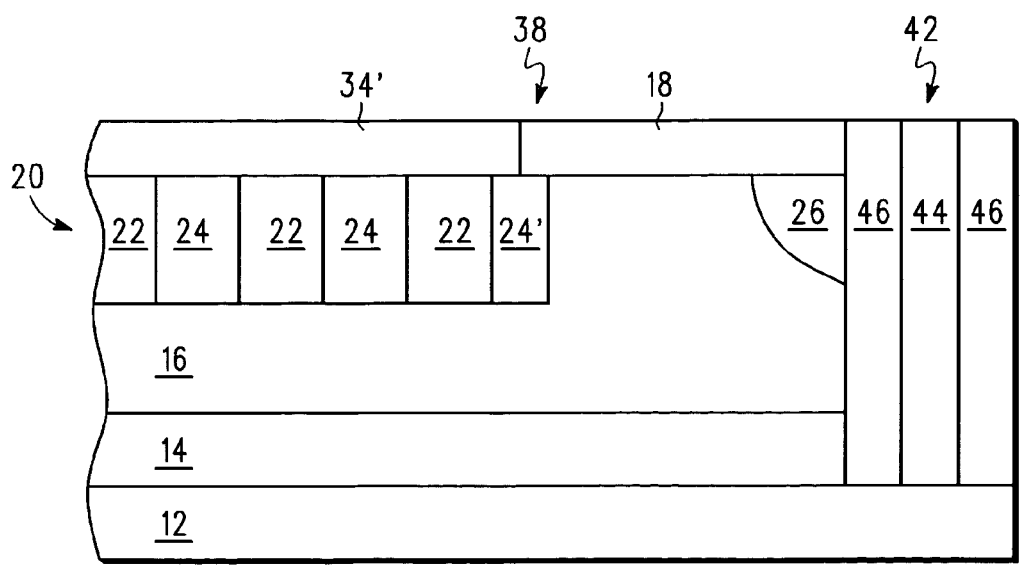
FIG. 4 is a partial, cross-sectional side view of a semiconductor device according to another embodiment.

As particularly shown in FIG. 2, the laterally disposed, alternating P-type regions 22 and the N-type regions 24 that form the super junction terminate at a termination structure 38. If the termination structure 38 is not properly designed, a device breakdown may occur at high voltages at the termination of the super junction device. In the termination structure 38 of one embodiment, the last column in the alternating P-type regions 22 and N-type regions 24 is an N-type region (designated 24' in FIG. 2). The width of N-type region 24' can be different from the widths of the other N-type regions 24. As an example, the N-type region 24' can be half as wide as N-type region 24. The epitaxial layer 16 may extend laterally from the final N-type region 24'. The width of the epitaxial layer 16 extending beyond the final N-type region 24' can be relatively wide, for example 5 to 15 microns. As shown in FIG. 2, the drain region 34 can terminate prior to the final N-type region 24'. Alternatively, FIG. 4 shows an embodiment similar to that of FIGS. 1-3, except that in this embodiment, a drain region 34' can extend partially over the final N-type region 24'.

The STI region 18 extends from the drain region 34 to a trench isolation structure 42. The trench isolation structure 42 is formed by a column 44 of polycrystalline material, such as polycrystalline silicon of the first dopant type, surrounded by two silicon oxide columns 46. The body region 26 can also extend to be adjacent the trench isolation structure 42.

As shown in FIG. 1, metal contacts 50, 52, 54 can be provided at the source region 32 drain region 34, and gate region 30, respectively.

At least one exemplary embodiment of the device 10 provides a highly uniform distribution of the electrical field at the termination structure of the super junction. Moreover, exemplary embodiments can provide an advantageous termination structure for the super junction that can be easily incorporated into a design library and without requiring additional layers within the semiconductor device. According to one embodiment, the device 10 improves the breakdown voltage and $R_{DS,ON}$ trade-off.

In one embodiment, the termination structure 38 is particularly advantageous in power super junction devices in the range of 80-105V. Optional bias schemes for the device 10 can include shorting the layer 14 to the drain region 34 or shorting the layer 14 to the source region 32. When the device 10 is utilizes an N-type buried layer as the layer 14, the layer 14 may be shorted to the source region 32 to operate the device 10 in an isolated mode. In such an embodiment, when the drain region 34 goes to negative due to inductive load switching, electron current will not go to the substrate 12. Instead, current will go to the source region 32 through the layer 14. When layer 14 is shorted to drain region 34, the device 10 can provide robust characteristics.

Various embodiments may utilize different dopants at different concentrations. Although the description above refers to P-type as being the first dopant and conductivity type and N-type as being the second dopant and conductivity type, it should be understood that the dopant types of the various regions may be switched, as is commonly understood in the art.

Figure 5:
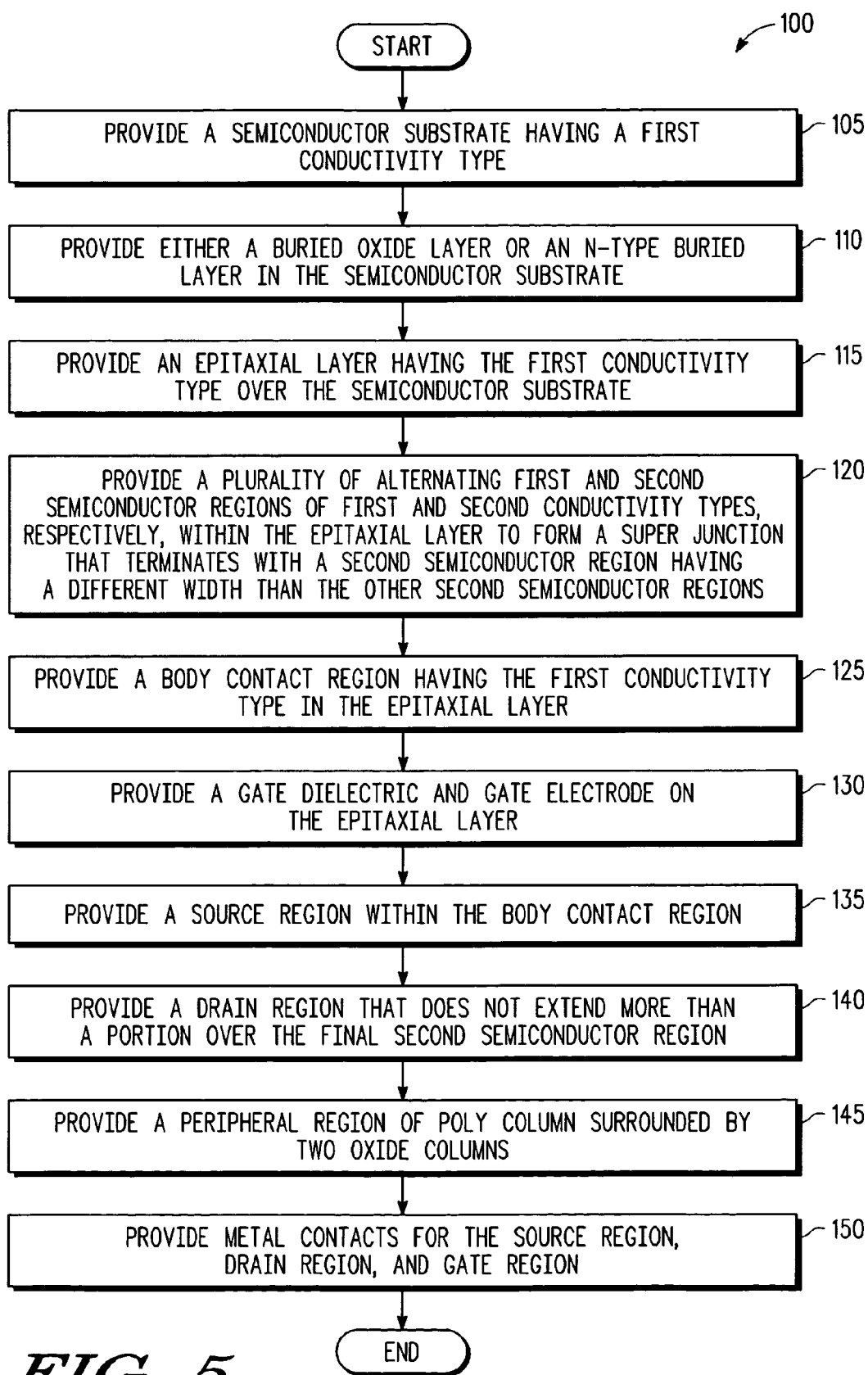
FIG. 5 is a flow diagram illustrating a method of manufacturing a semiconductor device according to one embodiment.

A method 100 of forming the semiconductor device 10 in accordance with an embodiment of the present invention will now be described with reference to FIGS. 1-4, and additionally with reference to the steps illustrated in FIG. 5. In this description, reference is made to layers and regions being formed of specific materials and materials having certain conductivity types, but this is for illustrative purposes only. It is not intended that the present invention be limited to the specific materials or physical parameters referred to herein. Moreover, the present invention should not be limited by the order of the steps, nor the particular manufacturing or design processes discussed herein.

In step 105 of method 100, a semiconductor substrate 12 having a first conductivity type (e.g., P-type) is provided. Next, in step 110, a layer 14 can be provided in the semiconductor substrate 12. As an example, the layer 14 can be a buried oxide layer or an N-type doped buried layer. In step 115, an epitaxial layer 16 having the first conductivity type is provided over the layer 14. In step 120, a plurality of alternating first and second semiconductor regions 22, 24 of the first and second conductivity types, respectively, are provided within the epitaxial layer 16 to form a super junction. The super junction can terminate with a second semiconductor region 24' having a width less than the other second semiconductor regions 24. As an example, the alternating first and second regions 22, 24 are P-type regions 22 and N-type regions 24 formed using ion implantation. In step 125, a body region 26 having the first conductivity type is provided in the epitaxial layer 16. As an example, the body region 26 is formed in the upper surface of the epitaxial layer 16 using ion implantation. In step 130, a gate dielectric 28 and a gate electrode 30 are provided on the upper surface of the epitaxial layer 16. In step 135, a source region 32 is formed within the body region 26. As an example, a source region 32 is formed within the body region 26 using ion implantation.

In step 140, a drain region 34, 34' that does not extend more than a portion over the final second semiconductor region 24' is provided. As shown in FIG. 2, the drain region 34 can terminate prior to the final second semiconductor region 24', or as shown in FIG. 4, the drain region 34' can extend partially over the final second semiconductor region 24'. As an example, the drain region 34, 34' can be formed on the epitaxial layer 16 using ion implantation.

In step 145, a trench isolation structure 42 can be provided. As an example, the trench isolation structure 42 can be formed by a column 44 of polycrystalline material such as polycrystalline silicon of the first dopant type surrounded by two silicon oxide columns 46. In step 150, metal contacts 50, 52, 54 can be provided at the source region 32, drain region 34, and gate region 30.

In accordance with one embodiment, a semiconductor device is provided. The device includes a first layer having a first-dopant type; a second layer over the first layer, the second layer having a second dopant type; a third layer over the second layer and having the first dopant type; and a plurality of first and second semiconductor regions within the third layer. The first semiconductor region has the first dopant type and the second semiconductor region has a second dopant type. The first and second semiconductor regions are disposed laterally relative to one another in an alternating pattern to form a super junction, and the super junction terminates with a final second semiconductor region of the second dopant type. The final second semiconductor region can have a first width and the other second semiconductor regions can each have a second width, and the first width can be different than the second width. The first width can be half the second width. The first dopant type can be P-type, and the second dopant type can be N-type. A drain region can be provided within the third layer over at least a portion of the first and second semiconductor regions. The drain region can extend over only a portion of the final second semiconductor region, or the drain region can not extend over the final second semiconductor region. The second layer can be an oxide layer, or the second layer can be a buried layer having the second dopant type. The third layer can surround one or more surfaces of the super junction, for example all but one surface of the super junction.

In another embodiment, a method of terminating a super junction is provided. The method can include providing a final second semiconductor region of the second dopant type. The providing step can include providing the final second semiconductor region with a first width and the other second semiconductor regions with a second width, and the first width can be less than the second width. The first width can be half the second width. The first dopant type can be P-type, and the second dopant type can be N-type. The device can further include a drain region within the third layer over at least a portion of the first and second semiconductor regions. The drain region can extend over only a portion of the final second semiconductor region. In an alternate embodiment, the drain region does not extend over the final second semiconductor region. The second layer can be an oxide layer, or the second layer can be a buried layer having the second dopant type. The third layer can surround all but one surface of the super junction.

In another embodiment, a method of manufacturing a semiconductor device is provided. The method includes providing a first layer having a first dopant type; providing a second layer over the first layer; providing a third layer over the second layer, the third layer having the first dopant type; and providing a plurality of first and second semiconductor regions within the third layer, the first semiconductor region having the first dopant type and the second semiconductor region having the second dopant type. The first and second semiconductor regions are disposed laterally relative to one another in an alternating pattern to form a super junction, and the super-junction terminates with a final second semiconductor region of the second dopant type. The final second semiconductor region can have a first width and the other second semiconductor regions can each have a second width, and the first width can be less than the second width.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A semiconductor device comprising:
   a first layer, wherein the first layer has a first dopant type;
   a second layer over the first layer;
   a third layer over the second layer, wherein the third layer has the first dopant type;
   a plurality of first and second semiconductor regions within the third layer, the first semiconductor region having the first dopant type and the second semiconductor region having a second dopant type,
   wherein the first and second semiconductor regions are disposed laterally relative to one another in an alternating pattern to form a super junction, and wherein the super junction terminates with a final second semiconductor region of the second dopant type; and
   a drain region within the third layer over at least a portion of the first and second semiconductor regions, wherein the drain region extends over only a portion of the final second semiconductor region.

2. The semiconductor device of claim 1, wherein the final second semiconductor region has a first width and each of the other second semiconductor regions have a second width, and wherein the first width is different from than the second width.

3. The semiconductor device of claim 2, wherein the first width is approximately half the second width.

4. The semiconductor device of claim 1, wherein the first dopant type is P-type and the second dopant type is N-type.

5. The semiconductor device of claim 1, wherein the second layer is an oxide layer.

6. The semiconductor device of claim 1, wherein the second layer is a buried layer having the second dopant type.

7. The semiconductor device of claim 1, wherein the third layer surrounds all but one surface of the super junction.

8. A method of manufacturing a semiconductor device comprising:
- providing a first layer having a first dopant type;
- providing a second layer over the first layer;
- providing a third layer over the second layer, the third layer having the first dopant type;
- providing a plurality of first and second semiconductor regions within the third layer, the first semiconductor region having the first dopant type and the second semiconductor region having the second dopant type,
- wherein the first and second semiconductor regions are disposed laterally relative to one another in an alternating pattern to form a super junction, and wherein the super-junction terminates with a final second semiconductor region of the second dopant type; and
- providing a drain region within the third layer over at least a portion of the first and second semiconductor regions, wherein the drain region does not completely extend over the final second semiconductor region.

9. The method of claim 8, wherein the final second semiconductor region has a first width and the other second semiconductor regions each have a second width, and wherein the first width is less than the second width.

10. The method of claim 8, wherein the providing the plurality of first and second semiconductor regions within the third layer includes providing the final second semiconductor region with a first width and the other second semiconductor regions with a second width, and wherein the first width is less than the second width.

11. The method of claim 10, wherein the first width is half the second width.

12. The method of claim 8, wherein the first dopant type is P-type and the second dopant type is N-type.

13. The method of claim 8, wherein the step of providing the second layer includes providing an oxide layer.

14. A semiconductor device comprising:
- a first layer, wherein the first layer has a first dopant type;
- a second layer over the first layer;
- a third layer over the second layer, wherein the third layer has the first dopant type; a plurality of first and second semiconductor regions within the third layer, the first semiconductor region having the first dopant type and the second semiconductor region having a second dopant type, wherein the first and second semiconductor regions are disposed laterally relative to one another in an alternating pattern to form a super junction, and wherein the super junction terminates with a final second semiconductor region of the second dopant type; and
- a drain region within the third layer over at least a portion of the first and second semiconductor regions, wherein the drain region does not extend over the final second semiconductor region.

15. The semiconductor device of claim 14, wherein the final second semiconductor region has a first width and each of the other second semiconductor regions have a second width, and wherein the first width is different from than the second width.

16. The semiconductor device of claim 15, wherein the first width is approximately half the second width.

17. The semiconductor device of claim 14, wherein the first dopant type is P-type and the second dopant type is N-type.

18. The semiconductor device of claim 14, wherein the second layer is an oxide layer.

19. The semiconductor device of claim 14, wherein the second layer is a buried layer having the second dopant type.

20. The semiconductor device of claim 14, wherein the third layer surrounds all but one surface of the super junction.

* * * * *